United States Patent [19]
Maeda

[11] Patent Number: 6,152,744
[45] Date of Patent: Nov. 28, 2000

[54] INTEGRATED CIRCUIT TEST SOCKET

[75] Inventor: Ryu Maeda, Tokyo, Japan

[73] Assignee: Molex Incorporated, Lisle, Ill.

[21] Appl. No.: 09/310,721

[22] Filed: May 12, 1999

[30] Foreign Application Priority Data

May 19, 1998 [JP] Japan ................................. 10-153866

[51] Int. Cl.$^7$ ................................................. H01R 12/00
[52] U.S. Cl. ........................................... 439/71; 439/331
[58] Field of Search .................................. 439/70, 71, 73, 439/331, 67, 68, 63, 581

[56] References Cited

U.S. PATENT DOCUMENTS

| | | | |
|---|---|---|---|
| 3,683,105 | 8/1972 | Shamash et al. | 174/68.5 |
| 4,927,369 | 5/1990 | Grabbe et al. | 439/66 |
| 4,932,883 | 6/1990 | Hsia et al. | 439/66 |
| 4,969,828 | 11/1990 | Bright et al. | 439/73 |
| 5,101,553 | 4/1992 | Carey | 29/882 |
| 5,205,742 | 4/1993 | Goff et al. | 439/73 |
| 5,207,585 | 5/1993 | Byrnes et al. | 439/66 |
| 5,442,852 | 8/1995 | Danner | 29/843 |
| 5,479,110 | 12/1995 | Crane et al. | 439/73 |
| 5,504,277 | 4/1996 | Danner | 174/261 |
| 5,556,293 | 9/1996 | Pfaff | 439/266 |
| 5,612,514 | 3/1997 | Lam | 174/261 |
| 5,637,832 | 6/1997 | Danner | 174/260 |
| 5,640,303 | 6/1997 | Hooley | 439/331 |
| 5,646,447 | 7/1997 | Ramsey et al. | 257/727 |
| 5,691,041 | 11/1997 | Frankeny et al. | 428/209 |
| 5,738,531 | 4/1998 | Beaman et al. | 439/71 |
| 5,741,141 | 4/1998 | O'Malley | 439/331 |
| 5,759,047 | 6/1998 | Brodsky et al. | 439/67 |
| 5,807,104 | 9/1998 | Ikeya et al. | 439/73 |
| 5,816,828 | 10/1998 | Ikeya et al. | 439/73 |
| 5,919,050 | 7/1999 | Kehley et al. | 439/71 |

*Primary Examiner*—Renee Luebke
*Assistant Examiner*—T. C. Patel
*Attorney, Agent, or Firm*—Charles S. Cohen

[57] ABSTRACT

Disclosed is an improved integrated circuit socket having electrically conductive pads formed on a resilient circuitry component for contacting the terminals of an integrated circuit (IC) package which is positioned on the resilient circuitry. The electrically conductive pads are arranged around the center area of the resilient circuitry to be in one-to-one correspondence with the terminals of the IC package. The electrically conductive pads have individual circuit paths of substantially the same length and which are extending outwardly from the center area of the flexible circuitry, and additional electrically conductive pads are formed on the back side of the flexible circuitry in order to effect the required electrical connections to exterior circuits. These electrically conductive pads on the back side are connected to the conductor pattern on the front side by conductive through holes or vias. With this arrangement all conductors have the same, reduced inductance. An insulative apertured film is preferably positioned intermediate the IC package and the flexible circuitry having the electrically conductive pads in order to perform certain alignment and pressure application functions.

23 Claims, 6 Drawing Sheets

INTEGRATED CIRCUIT TEST SOCKET

BACKGROUND OF THE INVENTION

The present invention relates to interconnect sockets for use in holding an integrated circuit (IC) package such as a ball grid array (BGA) package, a chip scale package (CSP) or an IC device of the bare chip type, the sockets being especially suitable for carrying out "burn-in" testing of such IC packages.

Integrated circuit devices each having a plurality of terminals (such as projecting solder balls) arranged in grid-form on its bottom surface are generally known in the art. Usually IC package sockets are used in determining the high frequency characteristics of such IC packages and also in making so-called burn-in tests of such IC packages. One example of such an IC package socket uses a plurality of upright probe pins each containing a spring therein. Another example of an IC package socket uses a plurality of terminals, which are stamped and shaped out of a thin metal sheet. The terminals are so arranged that they may be put in contact with the terminals of the IC package when put in the socket for the purpose of making required electrical connections between the IC package and exterior circuits.

Still another example of an IC package socket, which is proposed as appropriate for use in making a required electrical connection to numerous IC package pins arranged at reduced intervals, comprises an insulating flexible film having a conductive pattern formed thereon, each conductor ending with a metal bump.

As for the IC sockets which use spring-contained pins, each spring must be long enough to assure that a good electrical connection can be made relative to the corresponding one of the terminals of the IC package. In such sockets, the spring-contained pins each are 15 to 20 mm long, and accordingly the inductance of the probe pin is 10 nH or more. Thus, application of signals of several hundred megahertz high frequency to an IC package when contained in such an IC package test socket will cause a significant degree of voltage fluctuation due to the relatively large amount of inductance. This will cause an adverse effect on the testing of IC packages in terms of their electrical characteristics, especially in view of a recent tendency to design IC packages to work at a reduced voltage.

Regarding the IC socket which is of the type using stamped terminals, there is a problem of experiencing mismatches between the impedance of the IC package socket and the impedance of the exterior circuit. Such mismatching typically causes reflection of signals and cross-talk between adjacent terminals.

With reference to the type of IC socket which uses flexible circuitry, the conductors of the conductive pattern formed thereon usually extend different distances in radial directions, causing uneven distribution of inductances and impedances in the conductive pattern. Therefore, they often have similar drawbacks as IC package test sockets which incorporate stamped terminals. In testing IC packages, because the conductive projecting balls are arranged in a very close spacing, the testing leads of the test socket must be spread out in order to accommodate the test socket on a printed circuit board. Typically, this is accomplished with the use of a test frame to receive the IC package and, in effect, spread out the leads. Such an approach is expensive, and these frames are large. Avoiding these disadvantageous aspects of testing IC packages having such very close spacing is an important attribute of the invention.

SUMMARY OF THE INVENTION

One object of the present invention is to provide an improved integrated circuit socket having decreased inductance and impedance which is evenly distributed therein.

To attain this object, an IC package socket structure is designed such that a plurality of conductors of substantially equal length are formed on flexible circuitry in the form of a radiating or similar pattern. Flexible circuitry usually takes the form of flexible film circuitry, flat flexible circuitry ("FFC") or flexible printed circuitry ("FPC"). Each conductor has an electrically conductive pad at one end for contacting a selected one of the terminals of the IC package, and another electrically conductive pad is provided at the other end of the conductor for making a required electric connection to an outer circuit.

Specifically, the invention improves upon an IC package socket having a plurality of electrically conductive pads formed on its flexible circuitry for contacting the terminals of the IC package. According to the present invention, the plurality of electrically conductive pads are so formed around the flexible circuitry on the front side thereof that they will be in one-to-one corresponding relationship with the terminals of the IC package when engaged together. The electrically conductive pads have conductors of substantially the same length radially or otherwise extending therefrom to form a conductor pattern, typically around the center area of the flexible circuitry, and a plurality of additional electrically conductive pads are formed on the back side of the flexible circuitry for making the required electrical connections to exterior circuits, these electrically conductive pads on the back side being connected to the conductor pattern on the front side via conductive through holes thereof.

With this arrangement, the conductors connecting the electrically conductive pads on the front side of the flexible circuitry to the electrically conductive pads on the back side thereof can be significantly reduced in length, and accordingly the inductance of each conductor can be reduced. Also advantageously, each conductor is of substantially the same length, and therefore the same inductance will be distributed along each conductor in the conductor pattern.

The flexible circuitry may have a grounding layer formed on its back side, excluding the surrounding area of the electrically conductive pads on the back side thereof. Thus, the IC device socket is less likely to be sensitive to electromagnetic interference.

An insulative apertured sheet preferably is included. Such a sheet has holes made therein for aligning the terminals of the IC package with the electrically conductive pads around, for example, the center area of the flexible circuitry. With this arrangement, the terminals of the IC package can contact the electrically conductive pads of the insulating film, such being accomplished with a high degree of reliability.

An object of the invention is to provide a socket for testing IC packages having very closely spaced conductive balls and which eliminates the need for a large and expensive chip frame or carrier.

In an alternative embodiment, each of the electrically conductive pads on the back side of the flexible circuitry may be connected to a coaxial cable, typically with its center conductor connected to the electrically conductive pad on the back side and with its outer shield connected to the grounding layer on the back side. This has the effect of reducing significantly the impedance of the IC package socket and of preventing reflection of high-frequency signals and cross-talk between adjacent terminals.

Use may be made of a resilient bed having a plurality of elastomeric projections formed in opposing relationship with the electrically conductive pads on the front side of the flexible circuitry. A gentle push of the IC device against the flexible circuitry permits the establishment of a reliable electrical connection therebetween.

A hemispherical pusher may be used to push the IC package against the flexible circuitry. Each protruding ball of the IC package can be evenly applied to the respective electrically conductive pad at a right angle.

Other objects, features and advantages of the present invention will be understood from the following description of IC sockets according to the illustrated embodiments of the present invention, which are shown in accompanying drawings:

DESCRIPTION OF THE PREFERRED EMBODIMENTS

Figure 1:
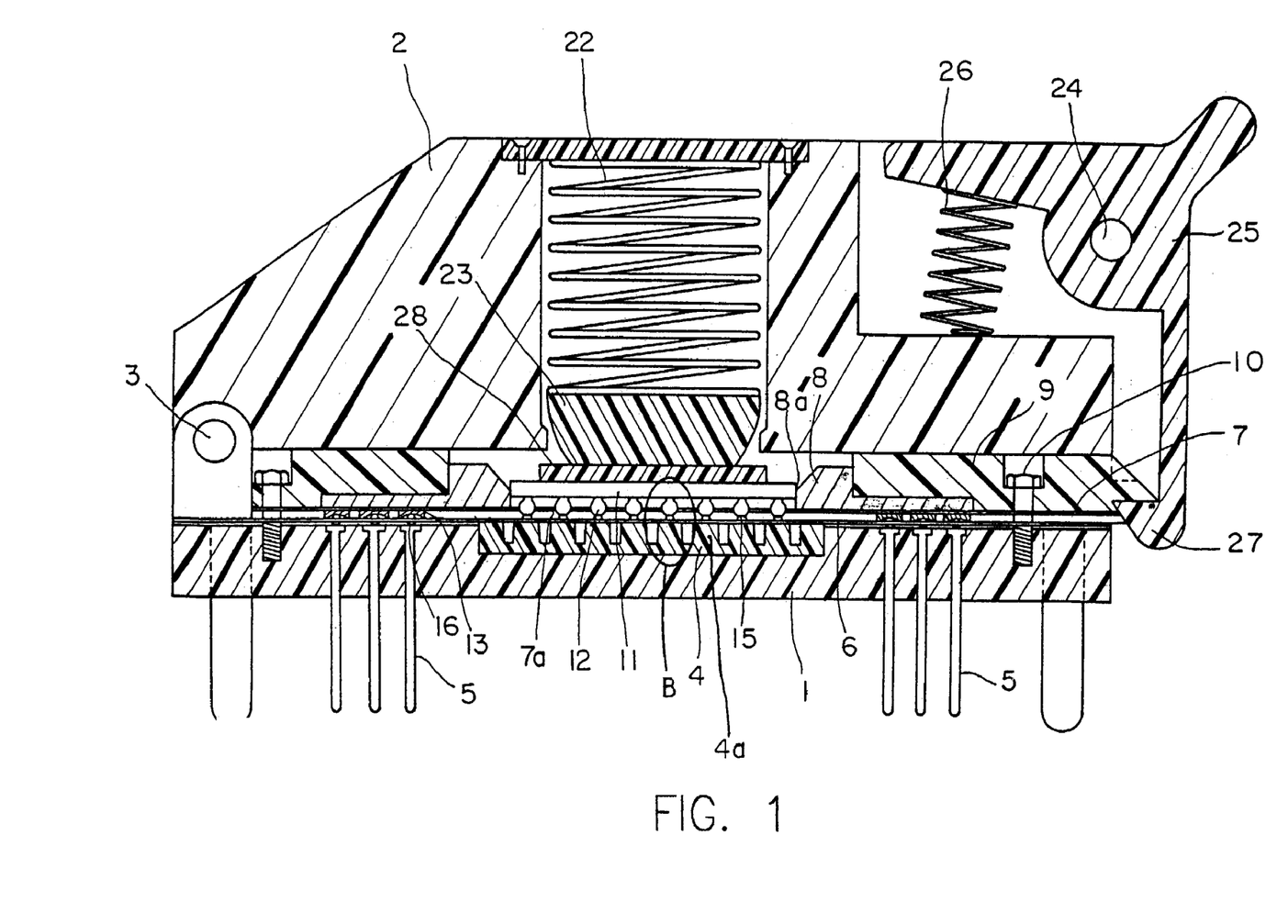
FIG. 1 is a sectional view of an IC socket according to a first embodiment of the present invention.
Figure 6:
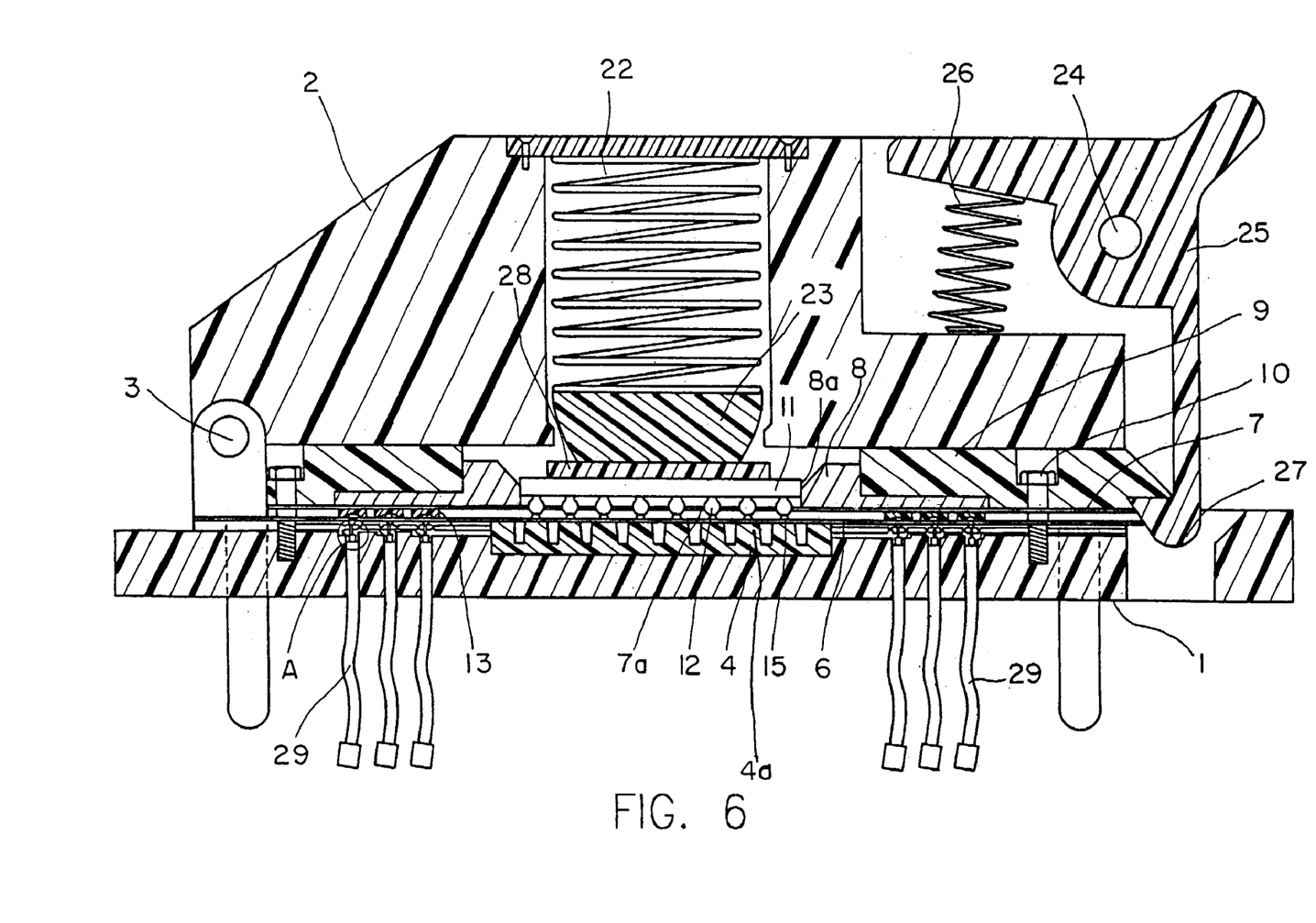
FIG. 6 is a sectional view of an IC socket according to a second embodiment of the present invention.

Referring to FIG. 1, an IC package socket is shown having a socket base 1 and a cover body 2 pivotally fixed to one end of the socket base 1, thereby permitting the cover body 2 to rotate about the pivot 3 for opening and closing. The socket base 1 has a resilient bed 4, preferably formed from silicone or other suitable resilient material, in its center area and a plurality of electrically conductive terminals 5 therearound. A film-like contact member or flexible circuitry member, shown as a planar member 6 such an FFC or an FPC, is laid on the socket base 1. FFC and FPC members are understood to be flexible circuitry extents provided in the form of a film. These terms are used interchangeably herein, often referred to by the term "flexible circuitry". An insulative apertured sheet 7 is laid on the flexible circuitry member 6 for accurately aligning an IC package. The flexible circuitry 6 and the apertured sheet 7 are shown in FIG. 1 and FIG. 6 fixed to the socket base 1 by using a center guide 8 and a surrounding frame 9, which are nested together in this illustrated arrangement so that the guide 8 overlies the flexible circuitry member 6 and the apertured sheet 7. Typically these are fixed to the socket base 1 with screws 10.

Figure 8:
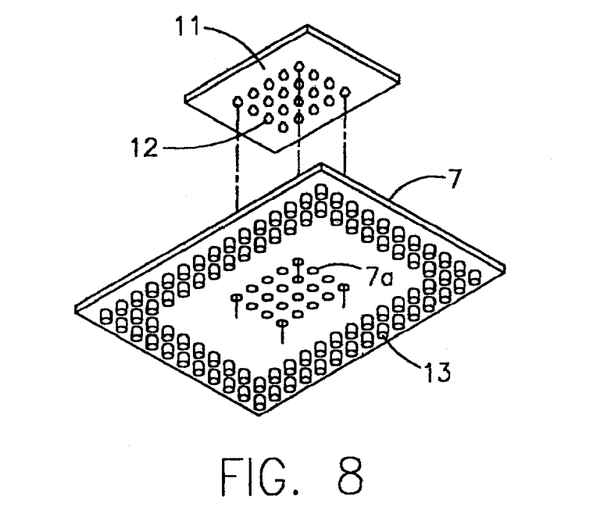
FIG. 8 is an exploded perspective view showing alignment characteristics of a chip and an apertured intermediate film member.
Figure 9:
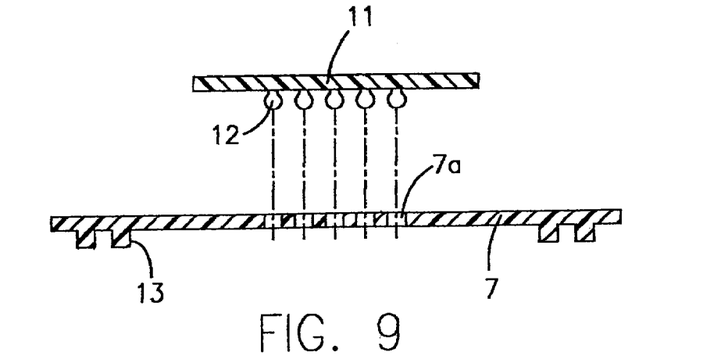
FIG. 9 is a cross-sectional view of FIG. 8.
Figure 10:
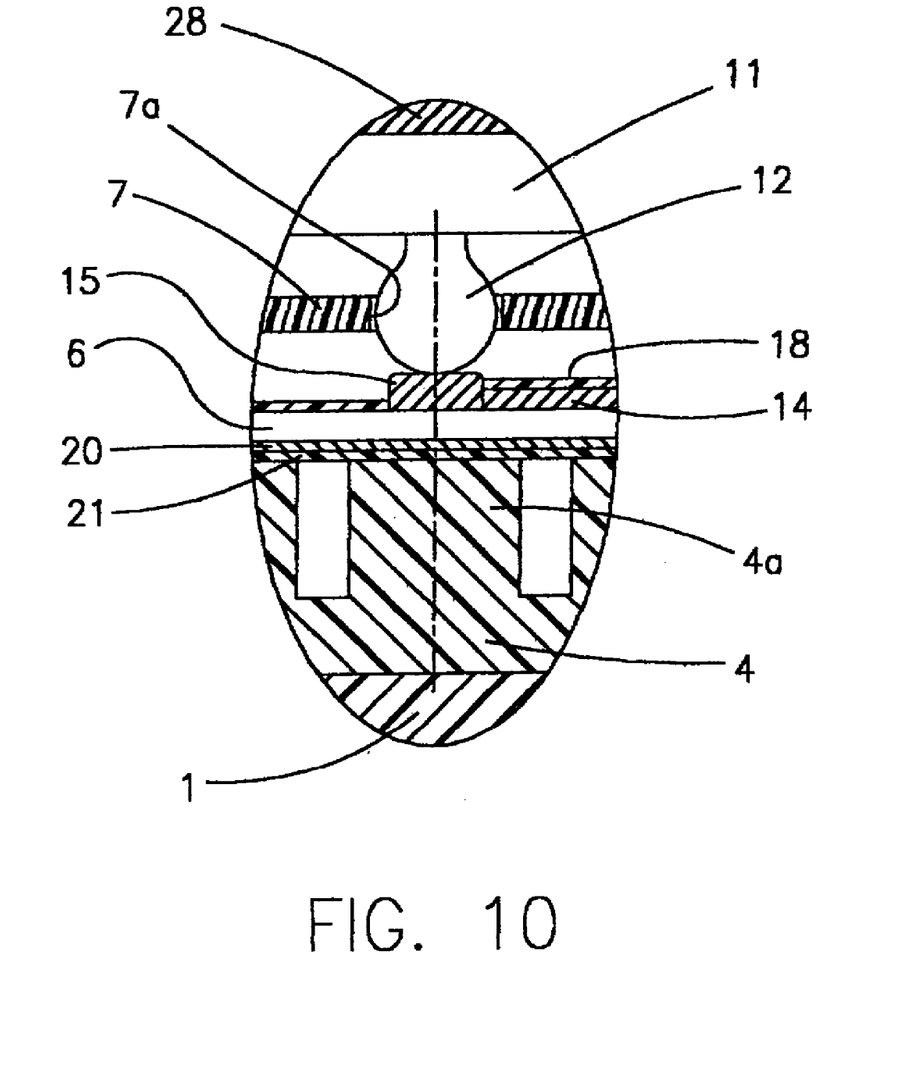
FIG. 10 is an enlarged view of the portion "B" of the IC socket and IC chip encircled in FIG. 1.

An integrated circuit (IC) 11 of the chip scale package (CSP) form is correctly positioned in this illustrated embodiment by fitting its peripheral sides in the center recess 8a of the socket base 1, as shown in FIG. 1. As best seen in the embodiment shown in FIGS. 8 and 9, the insulative apertured sheet 7 has a plurality of apertures 7a formed therein as a grid or other pattern and arranged in one-to-one corresponding relationship with the protruding balls or terminals 12 (which typically are solder balls) of the IC package 11. When the IC package 11 is snugly fitted in the recess of the socket base, the protruding balls 12 of the IC package 11 are aligned with and extend through the holes 7a of the apertured sheet 7. As shown in FIGS. 1, 8 and 9, the apertured sheet 7 has elastomeric projections 13 aligned with the electrically conductive terminals 5 on the socket base 1.

The flexible circuitry member 6 is used in making electrical connections between the projecting balls 12 of the IC package 11 and the electrically conductive terminals 5 of the socket base 1. As seen from FIGS. 2 to 5, the flexible circuitry has a plurality of conductors extending radially or otherwise from electrically conductive pads 15, which are arranged around its square center area on the front side, and a corresponding plurality of electrically conductive pads 16 are provided on the back side. These electrically conductive pads 16 on the back side of the flexible circuitry member 6 are connected to the conductor ends on the front side by vias, such as illustrated conductive through holes 17, which are made to extend through the thickness of the flexible circuitry member 6. The electrically conductive pads 15 around the square center area of the member 6 are arranged to oppose and be substantially aligned with the holes 7a of the overlying insulative apertured sheet 7 in one-to-one correspondence. These pads 15 also are aligned with and confront the protruding balls 12 of the IC package 11. In addition, the electrically conductive pads 16 on the back side of the flexible circuitry member 6 are so arranged that they are aligned for engaging the electrically conductive terminals 5 of the socket base 1 in one-to-one correspondence. The top surface of these electrically conductive pads 16 also confront the elastomeric projections 13 of the overlying apertured sheet 7.

Figure 2:
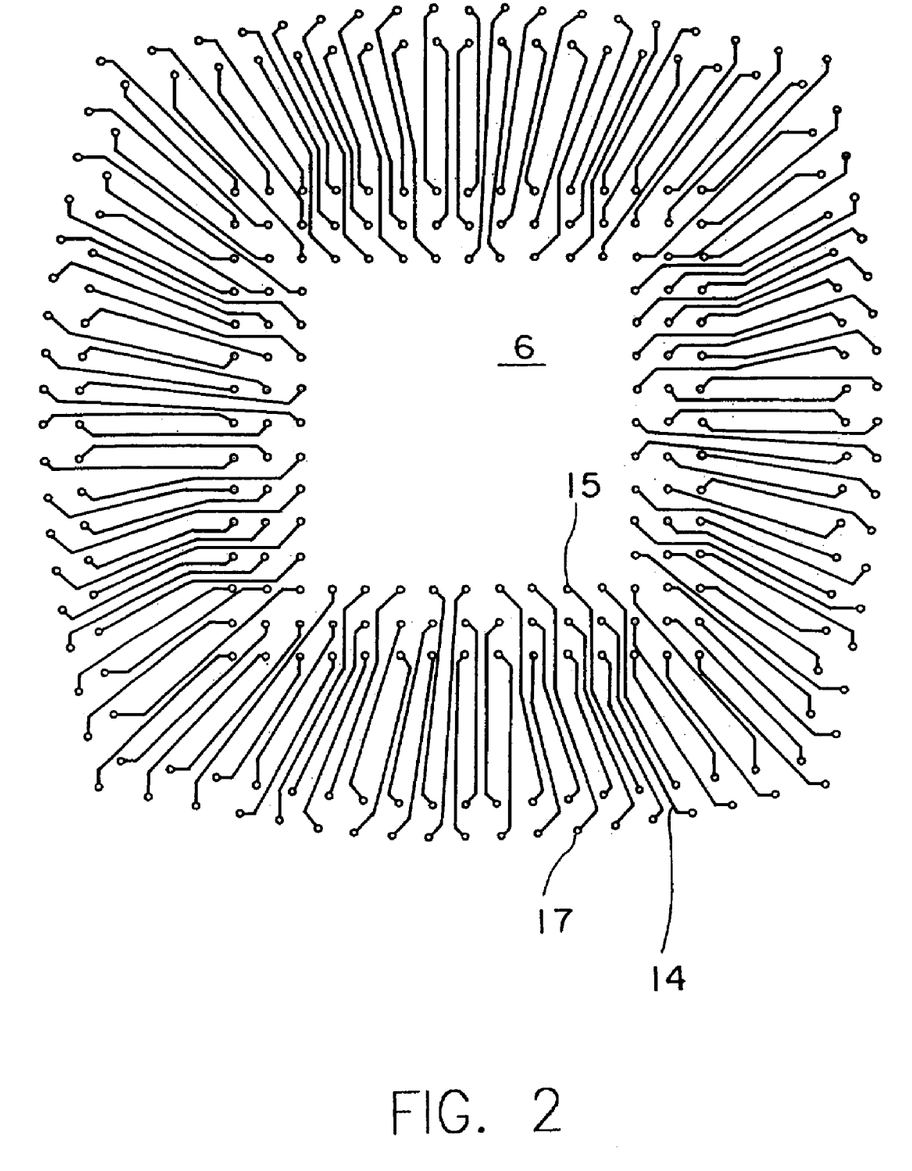
FIG. 2 shows a typical conductor pattern formed on an insulating film.

As best seen from FIG. 2, the conductors extend radially or in any suitable pattern from the electrically conductive pads 15 around the square center area to the electrically conductive pads 16 in the circumference area of the flexible circuitry member 6. The conductor pattern 14 is designed such that all conductors may be of substantially the same length. With the objective of reducing the inductance of each conductor, a ground plane 20 or ground planes may be added to the flexible circuitry 6 to create striplines or microstriplines of substantially uniform thickness. As seen from FIGS. 3 to 5, the conductor pattern 14 serves to connect the electrically conductive pads 15 on the front side of the member 6 to the electrically conductive pads 16 on the back side thereof. Specifically, each conductor 14 is electrically connected at one end to a respective electrically conductive pad 15 on the front side, and at the other end to a respective electrically conductive pad 16 on the back side. Each pad 16 has an electrically conductive through hole 17 which has a thickness such that it extends through the flexible circuitry member. All electrically conductive pads 16 and 16a and electrically conductive through holes 17 can be formed simultaneously, and the electrically conductive pads 16a are formed to be connected to the other ends of the conductors 14.

Figure 3:
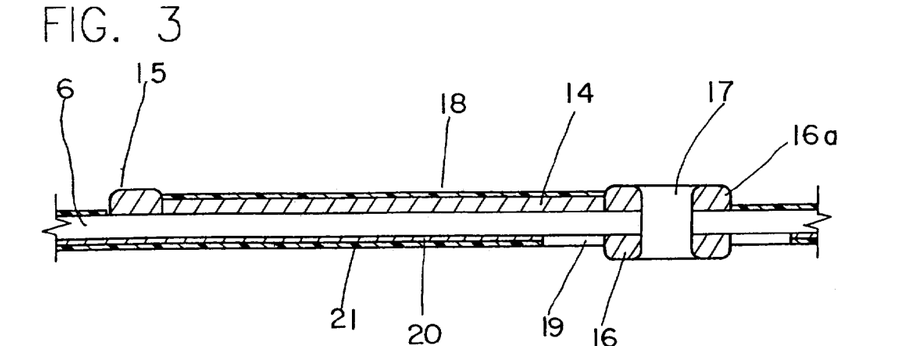
FIG. 3 is an enlarged sectional view of a fragment of the insulating film in a selected radial direction.
Figure 4:
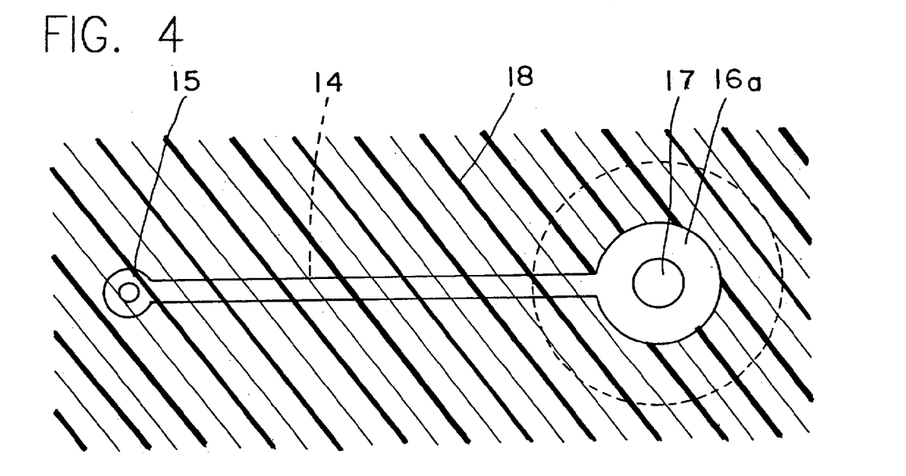
FIG. 4 is an enlarged plan view of the fragment of the insulating film, showing a selected conductor on the front side of the insulating film.
Figure 5:
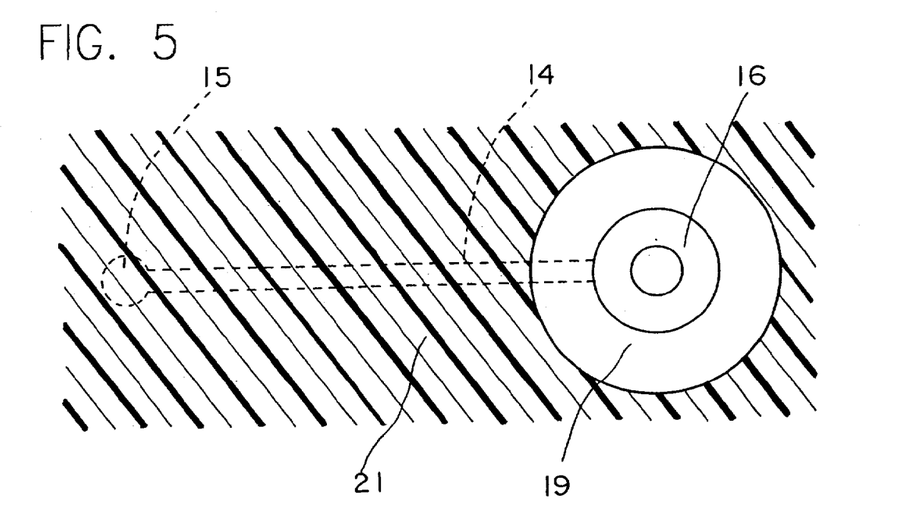
FIG. 5 is a similar enlarged plan view of the fragment of the insulating film, showing the selected conductor on the back side of the insulating film.

The front surface of the flexible circuitry member 6 is coated with an insulative and protective material except for the electrically conductive pads 15 and 16a, in order to provide a protection layer 18, as illustrated in FIGS. 3 and 4. Likewise, the back surface of the member 6 is coated with copper except for the electrically conductive pads 16 and surrounding annular areas 19, to thereby provide the ground plane layer 20. The ground plane layer 20 is then coated with an insulative and protective material in order to provide a protection layer 21, as illustrated in FIG. 5.

The ground plane layer 20 preferably is formed by evaporation or plating, and has a thickness of 10 μm or less. This layer 20 may be etched to be in a lattice pattern, thereby retaining the flexibility of the member 6. Alternatively, the ground plane layer 20 may be formed by applying an electrically conductive polymer paste to the flexible circuitry member, using silicone resin, polyimide resin, thermoplastic resin, epoxy resin or any other appropriate synthetic resin as a binder. Otherwise, a composite ground plane layer may be formed by evaporating or plating with copper, and by printing with such an electrically conductive polymer paste.

Returning to FIG. 1, the cover body 2 has a hemispherical pusher 23 biased with a coil spring 22. The cover body 2 has a spring-biased hook 25 rotatably pivoted to the side of the cover body 2, which side is opposite to the pivoting side of the cover body 2. The hook 25 is biased toward the latching position with a coil spring 26. When the cover body 2 is rotated to its closed position, the cover body 2 is kept in the closing position with the spring-biased hook 25 caught under the counter edge portion of the frame 9 of the socket base 1, preventing the cover body 2 from opening.

In putting an IC package 11 in the IC package socket, first the cover body 2 is opened and raised, and the IC package 11 is inserted into the opening 8a of the base frame 8 with its projecting balls 12 directed downwardly, and an elastic sheet 28 is laid on the IC package 11. The cover body 2 then is rotated to the closed position, at which the cover body 2 is held with the catch portion 27 of the hook 25 caught under the counter edge portion of the frame 9 of the socket base 1.

Through such actions, the IC package 11 is pushed against the insulative apertured sheet 7 by the hemispherical pusher 23 with the projecting balls 12 of the IC package 11 aligned with and extending through the holes 7a of the apertured sheet 7, and then the projecting balls 12 of the IC package 11 contact the electrically conductive pads 15 on the top surface of the flexible circuitry member 6, making reliable electrical connections therebetween by sandwiching the IC package 11 and the member 6 between the overlying elastic sheet 28 and the underlying resilient bed 4. Resilient bed 4 can have a flat working surface (as seen in FIG. 6) or include one or more upright pedestals 4a (as seen in FIG. 1) arranged in a pattern in opposition to the balls 12 of the IC package 11. When provided, the upright pedestals are defined in part by intervening spaces 37, which permit each pedestal 4a to deflect individually.

IC packages are manufactured such that their projecting balls 12 should be symmetrically shaped and have good coplanarity. Even if the projecting solder balls 12 have some unevenness or are otherwise misshapened, their irregularity can be absorbed by the resilient flexibility of the elastic sheet 28 and the resilient bed 4. In addition, the elastomeric projections 4a of the resilient bed 4 are arranged relative to the electrically conductive pads 15 in one-to-one opposing relationship, thereby permitting required electric connections to be made between the projecting balls 12 and the electrically conductive pads 15 by applying a gentle push to the IC package 11. The hemispherical pusher 23 is free to change its posture in pressing the IC deice so as to apply its pushing force to the projecting balls 12 of the IC package 11 evenly and at a right angle.

The electrically conductive pads 16 formed on the circumference area of the back side of the flexible circuitry member 6 are pushed against the electrically conductive terminals 5 of the socket base 1 via the elastomeric projections 13 of the apertured sheet 7 when the frame 9 is engaged with the socket base 1. The elastomeric projections 13 and the member 6 are flexible enough to absorb insufficient evenness of the electrically conductive terminals 5, if any undesired irregularities exist thereon.

Thus, required electrical connections are established between the projecting solder balls 12 of the IC package 1 1 and the electrically conductive terminals 5 of the socket base 1. The conductor pattern 14 of the flexible circuitry member 6 is composed of conductors of substantially the same length, each making an electrical connection of low-inductance between each projecting ball 12 and the corresponding electrically conductive terminal 5. The ground plane layer 20 on the back side of the member 6 has the effect of preventing electromagnetic interference on the conductor pattern 14.

Figure 7:
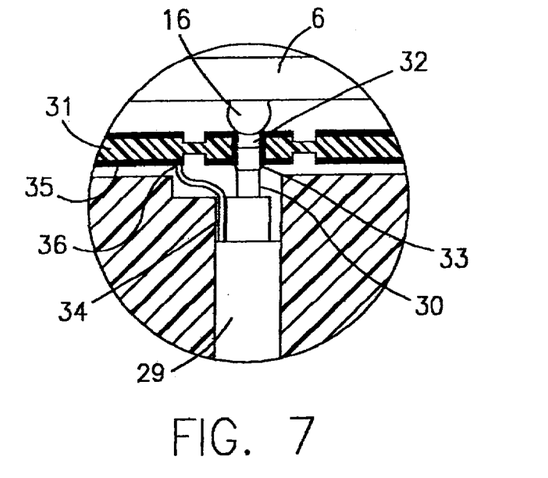
FIG. 7 is an enlarged view of the portion "A" of the IC socket encircled in FIG. 6.

FIGS. 6 and 7 show an IC package socket according to the second embodiment, which is different from the first embodiment primarily in that coaxial cables 29 are used in place of the electrically conductive terminals or pins 5 of the first embodiment. The parts of the second embodiment which are the same as those of the first embodiment are indicated by the same reference numerals which are used in FIGS. 1 to 5, and descriptions of such similar parts are omitted from the description of this second embodiment.

As seen from FIG. 7, the center conductor 30 of each coaxial cable 29 is soldered to the electrically conductive through hole 32 whereas the outer shield 34 is soldered to the ground layer 35, which encircles the electrically conductive through hole 32. The electrically conductive through holes 32 of a contact film 31 substantially align with and confront the electrically conductive pads 16 on the back side of the flexible circuitry member 6.

In the IC package socket according to the second embodiment, a grounding layer (not shown) may be laid on the front or back side of the insulative apertured sheet 7, in a manner so as to not contact the projecting balls 12 of the IC package. Thus, the grounding layer of the apertured sheet 7 and the ground plane layer 20 of the back side of the insulating film combine to sandwich the conductor pattern 14 therebetween, thereby raising the capacitance and lowering the impedance of the conductor pattern. Also, the conductor pattern may be matched with the coaxial cables in impedance, thereby preventing reflection of high-frequency signals or cross-talk.

It will be appreciated that, in either embodiment, the flexible circuitry member 6 may be replaced by another film circuitry or flat planar circuitry member having electrically conductive pads arranged at intervals which are different from those illustrated herein. In that event, the resilient bed 4 preferably would have the elastomeric protrusions or upright pedestals 4a arranged at the same intervals as the electrically conductive pads in the replaced flexible circuitry member, thereby permitting the electrically conductive pads 15 to be put into contact with the elastomeric protrusions 4a in one-to-one correspondence, as illustrated in FIG. 1.

With more particular reference to the aligning and mating relationship between the IC package 11 being tested and the insulative apertured sheet 7 of the invention, reference is made to FIGS. 1, 6, 8 and 9. Apertured sheet 7 is a member interposed between the particular IC device and the flexible circuitry member 6 with its electrically conductive pads 15. It functions to assist with proper alignment between the protruding balls 12 of the IC package 11 and its particular ball grid array. In this regard, the alignment holes 7a are positioned in an array which corresponds with the ball grid array of the IC device, and different apertured sheets 7 can be provided to be interchanged depending upon the ball grid array to be accommodated, typically including inserting the balls 12 into the holes 7a. This alignment function is illustrated with more particularity in FIGS. 8 and 9.

Importantly, the apertured sheet 7 also functions as a pressure film. Elastomeric projections 13 assist in securing the electrical connections between the electrically conductive pads 16 on the back side of the member 6 and the conductors of the pins or terminals 5 or of the coaxial cables 29. More specifically, when the socket is fully assembled, the elastomeric projections 13 assure that the assembly pressure urges the electrically conductive pads 16 and their respective conductive through holes or vias 17 against the conductive interface portion of the particular terminal 5 or coaxial cable 29. This function minimizes the risk of short circuit development, especially in those situations where surface contaminants, unevenness or other imperfections could lead to poor electrical engagement between the pads 16 and the terminals 5 or coaxial cables 29. Accordingly, the apertured sheet 7 acts as a compliant member and provides a measure of compliance or "give" so as to compensate for imperfect tolerances or for contamination, especially on the balls 12 which typically are soldered structures which can on occasion exhibit imperfections.

It will be understood that the embodiments of the present invention which have been described are illustrative of some of the applications of the principles of the present invention. Numerous modifications may be made by those skilled in the art without departing from the true spirit and scope of the invention.

What is claimed is:

1. An integrated circuit socket for testing integrated circuit (IC) packages, said socket comprising:

a socket assembly having a base;

an extent of flexible circuitry supported by said base, said flexible circuitry having a back side and a front side and a plurality of conductive vias extending between said front side and said back side;

a plurality of front side electrically conductive pads on said front side of the flexible circuitry for contacting terminals of an IC package positioned in said socket assembly, said plurality of front side electrically conductive pads being in one-to-one correspondence with the terminals of the IC package;

a conductor pattern of a plurality of individual circuit paths on said flexible circuitry, each said individual circuit path extending from one of said front side electrically conductive pads to one of said conductive vias of the flexible circuitry;

a plurality of back side electrically conductive pads on said back side of the flexible circuitry for electrical connection with externally projecting conductive connectors, said back side electrically conductive pads being connected by said conductive vias to the conductor pattern on the front side of the flexible circuitry; and an insulative apertured sheet positioned between said flexible circuitry and the IC package, said insulative apertured sheet having holes therein for placing the terminals of the IC package therethrough, and said holes further being aligned with said front side electrically conductive pads of the flexible circuitry.

2. The integrated circuit socket according to claim 1, wherein the flexible circuitry has a conductive ground plane layer formed on said back side, excluding the surrounding area of the back side electrically conductive pads.

3. The integrated circuit socket according to claim 2, wherein said socket assembly includes projecting conductive coaxial cable assemblies, and wherein each said back side electrically conductive pad of the flexible circuitry film is connected to a center conductor of one of said coaxial cable assemblies, and an outer shield thereof is connected to the ground plane layer of the flexible circuitry.

4. The integrated circuit socket according to claim 1, further including a resilient bed supported by said base, and positioned in opposing relationship with the front side electrically conductive pads of the flexible circuitry.

5. The integrated circuit socket according to claim 1, wherein the socket assembly includes a hemispherical pusher to push the IC package against said flexible circuitry.

6. The integrated circuit socket according to claim 1, wherein said externally projecting conductive connectors are projecting conductive pin terminals.

7. The integrated circuit socket according to claim 1, wherein said insulative apertured sheet further includes elastomeric projections which are in one-to-one correspondence with said back side electrically conductive pads of the flexible circuitry.

8. The integrated circuit socket according to claim 1, wherein said insulative apertured sheet farther includes elastomeric projections which are in one-to-one correspondence with said back side electrically conductive pads of the flexible circuitry, and said elastomeric projections exert pressure on a top surface of said back side conductive pads to enhance the electrical connection with said externally projecting conductive connectors.

9. The integrated circuit socket according to claim 7, wherein said insulative apertured sheet, said elastomeric projections of the apertured sheet, said flexible circuitry, and said back side electrically conductive pads have a combined thickness which is equal to or greater than spacing provided by the socket assembly within which they are positioned to thereby enhance electrical contact between said a top surface of said back side electrically conductive pads and said engagement surface of the projecting conductive connector.

10. An integrated circuit socket for testing integrated circuit (IC) packages, said socket comprising:

a socket assembly having a base;

a flexible circuitry member supported by said base, said flexible circuitry having a back side, a front side and a plurality of through holes extending between said front side and said back side;

a plurality of front side electrically conductive pads on said front side of the flexible circuitry member for contacting terminals of an IC package positioned in said socket assembly, said plurality of front side electrically conductive pads being in one-to-one a correspondence with the terminals of the IC package;

an insulative apertured sheet positioned between said flexible circuitry member and the IC package, said apertured sheet having holes therein for placing at least some of the terminals of the IC package in registration with at least some of said front side electrically conductive pads of the flexible circuitry member;

a conductor pattern of a plurality of individual circuit paths on said flexible circuitry member, each said individual circuit path extending from one of said front side electrically conductive pads to one of said through holes of the flexible circuitry member;

a plurality of back side electrically conductive pads on said back side of the flexible circuitry member, said back side electrically conductive pads being connected by said through holes to the conductor pattern on the front side of the flexible circuitry member; and a plurality of pin terminals projecting from said socket and in alignment with at least some of said back side electrically conductive pads.

11. The integrated circuit socket according to claim 10, wherein the flexible circuitry member has a ground plane layer formed on said back side, excluding the surrounding area of the back side electrically conductive pads.

12. The integrated circuit socket according to claim 11, wherein said socket assembly includes projecting conductive coaxial cable assemblies, and wherein each said back side electrically conductive pad of the flexible circuitry member is connected to a center conductor of one of said coaxial cable assemblies, and an outer shield thereof is connected to the ground plane layer of the flexible circuitry member.

13. The integrated circuit socket according to claim 10, further including a resilient bed supported by said base, and said resilient bed has a plurality of elastomer projections positioned in opposing relationship with the front side electrically conductive pads of the flexible circuitry members.

14. The integrated circuit socket according to claim 10, wherein the socket assembly includes a hemispherical pusher to push the IC package against said flexible circuitry member.

15. An integrated circuit socket for testing integrated circuit (IC) packages, said socket comprising:

a socket assembly having a base and externally projecting conductive members, said base having an outer circumferential edge;

a flexible circuitry member supported by said base, said flexible circuitry having a back side, a front side and a plurality of conductive through holes extending between said front side and said back side;

a plurality of front side electrically conductive pads on said front side of the flexible circuitry member for contacting terminals of an IC package positioned in said socket assembly, said plurality of front side electrically conductive pads being in one-to-one a correspondence with the terminals of the IC package;

an insulative apertured sheet positioned between said flexible circuitry member and the IC package, said apertured sheet having holes therein for placing the terminals of the IC package in registration with said front side electrically conductive pads of the flexible circuitry member, said insulative apertured sheet having elastomeric portions positioned generally between said holes and said outer circumferential edge of said base;

a conductor pattern of a plurality of individual circuit paths on said flexible circuitry member, each said individual circuit path extending from one of said front side electrically conductive pads to one of said conductive through holes of the flexible circuitry member;

a plurality of back side electrically conductive pads on said back side of the flexible circuitry member for electrical connection with said externally projecting conductive members, said back side electrically conductive pads being connected by said through holes to the conductor pattern on the front side of the flexible circuitry member; and said back side electrically conductive pads are positioned generally between said front side pads of the flexible circuitry member and said outer circumferential edge of said base and are in one-to-one correspondence with said elastomeric portions of the insulative apertured sheet.

16. The integrated circuit socket according to claim 15, wherein the flexible circuitry member has a ground plane layer formed on said back side, excluding the surrounding area of the back side electrically conductive pads.

17. The integrated circuit socket according to claim 15, wherein said insulative apertured sheet, said elastomeric projections of the apertured sheet, said flexible circuitry member, and said back side electrically conductive pads have a combined thickness which is equal to or greater than spacing between an engagement surface of each of said projecting conductive members and an opposing surface of the socket assembly to thereby enhance electrical contact between said back side electrically conductive pads and said engagement surface of the projecting conductive member.

18. The integrated circuit socket according to claim 15, wherein each of said plurality of individual circuit paths is of substantially the same length and exhibits substantially the same inductance and impedance values.

19. The integrated circuit socket according to claim 15, further including a resilient bed supported by said base, and said resilient bed has a plurality of elastomer projections positioned in opposing relationship with the front side electrically conductive pads of the flexible circuitry members.

20. An integrated circuit socket for testing integrated circuit (IC) packages, said socket comprising:

a socket assembly having a base;

a flexible circuitry member supported by said base, said flexible circuitry having a back side, a front side and a plurality of through holes extending between said front side and said back side;

a plurality of front side electrically conductive pads on said front side of the flexible circuitry member for contacting terminals of an IC package positioned in said socket assembly, said plurality of front side electrically conductive pads being in one-to-one a correspondence with the terminals of the IC package;

an insulative apertured sheet positioned between said flexible circuitry member and the IC package, said apertured sheet having holes therein for placing at least some of the terminals of the IC package in registration with at least some of said front side electrically conductive pads of the flexible circuitry member;

a conductor pattern of a plurality of individual circuit paths on said flexible circuitry member, each said individual circuit path extending from one of said front side electrically conductive pads to one of said through holes of the flexible circuitry member;

a plurality of back side electrically conductive pads on said back side of the flexible circuitry member, said back side electrically conductive pads being connected by said through holes to the conductor pattern on the front side of the flexible circuitry member; and said insulative apertured sheet further includes elastomeric projections which are in one-to-one correspondence with said back side electrically conductive pads of the flexible circuitry member.

21. The integrated circuit socket according to claim 20, further including a resilient bed supported by said base, and said resilient bed has a plurality of elastomer projections positioned in opposing relationship with the front side electrically conductive pads of the flexible circuitry members.

22. The integrated circuit socket according to claim 20, wherein the socket assembly includes a hemispherical pusher to push the IC package against said flexible circuitry member.

23. The integrated circuit socket according to claim 20, wherein said insulative apertured sheet, said elastomeric projections of the apertured sheet, said flexible circuitry member, and said back side electrically conductive pads have a combined thickness which is equal to or greater than spacing provided by the socket assembly to thereby enhance electrical contact between said a top surface of the back side electrically conductive pads and said engagement surface of the projecting conductive connector.

* * * * *